(12) United States Patent
Lee

(10) Patent No.: US 6,369,417 B1
(45) Date of Patent: Apr. 9, 2002

(54) CMOS IMAGE SENSOR AND METHOD FOR FABRICATING THE SAME

(75) Inventor: Ju-Il Lee, Ichon (KR)

(73) Assignee: Hyundai Electronics Industries Co., Ltd., Kyungki-Do (KR)

(*) Notice: Subject to any disclaimer, the term of this patent is extended or adjusted under 35 U.S.C. 154(b) by 0 days.

(21) Appl. No.: 09/931,119

(22) Filed: Aug. 16, 2001

(30) Foreign Application Priority Data

Aug. 18, 2000 (KR) .............................................. 00-47853

(51) Int. Cl.[7] ..................... H01L 31/062; H01L 31/113; H01L 31/0232

(52) U.S. Cl. ........................ 257/294; 257/292; 257/432; 438/59; 438/65; 438/69; 438/73

(58) Field of Search ................................ 257/290, 291, 257/292, 294, 432; 438/59, 65, 69, 73

(56) References Cited

U.S. PATENT DOCUMENTS 5,986,297 A * 11/1999 Guidash et al. ............. 257/223
6,180,969 B1 * 1/2001 Yang et al. .................. 257/291

* cited by examiner

*Primary Examiner*—Ngân V. Ngô
(74) *Attorney, Agent, or Firm*—Marshall, Gerstein & Borun

(57) ABSTRACT

A CMOS image sensor fabrication method that is capable of preventing a surface of a metal line from being damaged or contaminated is provided. The formed CMOS image sensor includes: a semiconductor structure, wherein the semiconductor structure includes a unit pixel area and a pad area; a metal line formed on the pad area, wherein a portion of the metal line is exposed; a passivation layer formed on the unit pixel area and on the metal line such that the exposed portion is left exposed; a planarized photoresist formed on a portion of the passivation layer; a micro-lens formed on a portion of the planarized photoresist; and an oxide layer formed on the entire formed structure such that the exposed portion is left exposed.

15 Claims, 6 Drawing Sheets

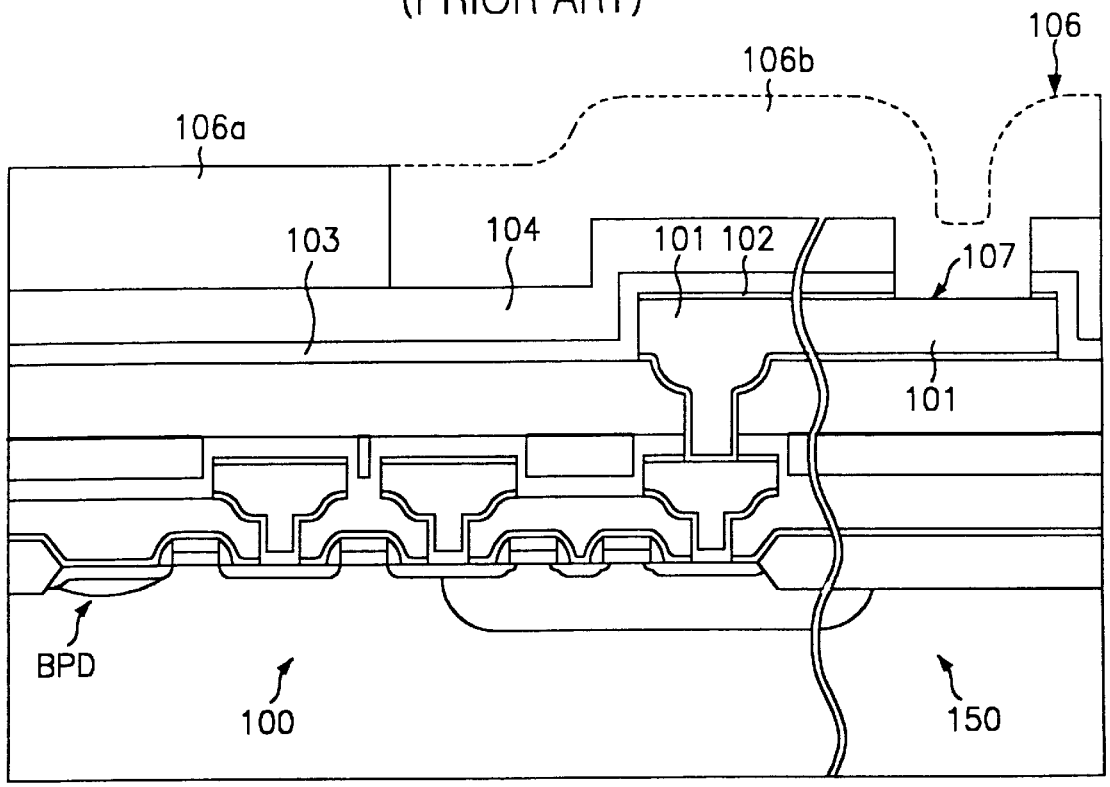
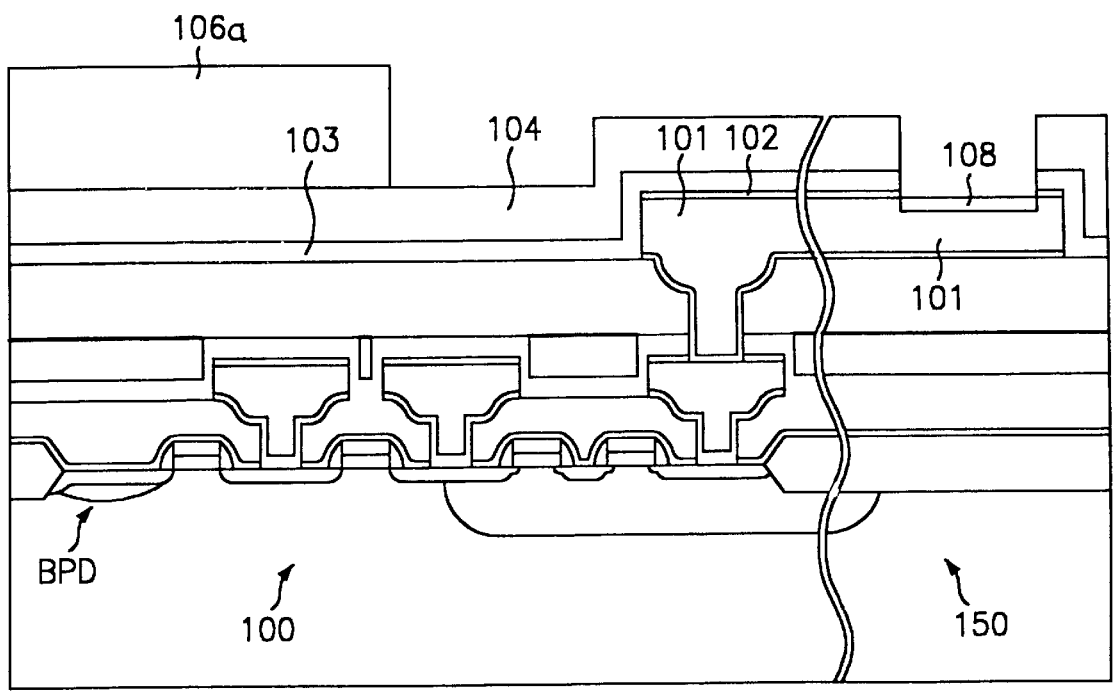

CMOS IMAGE SENSOR AND METHOD FOR FABRICATING THE SAME

FIELD OF THE INVENTION

The present invention relates generally to a semiconductor device, and, more particularly, to a CMOS image sensor capable of preventing a surface of a metal line therein from being damaged or contaminated, thereby improving performance of a semiconductor memory device.

BACKGROUND OF THE INVENTION

As is well known, an image sensor is an apparatus generating image data by sensing a light beam reflected from an object. An exemplary image sensor fabricated by a complementary metal oxide semiconductor (CMOS) technology is called a CMOS image sensor.

Generally, the CMOS image sensor includes a plurality of unit pixels, each unit pixel including a light sensing element and a plurality of transistors. The light sensing element, such as a photodiode, senses an incident light beam and generates photoelectric charges corresponding to the amount of the incident light beam received. The transistors perform switching operations to control transfer of the photoelectric charges.

FIGS. 1A to 1D are cross-sectional views showing sequential steps of fabricating a conventional CMOS image sensor. Here, reference numerals 100 and 150 represent a unit pixel area and a pad area, respectively. For convenience purposes, the distance between the unit pixel area 100 and the pad area 150 has been truncated by a split view.

Referring to FIG. 1A, a series of operations are carried out to provide a semiconductor structure that has a metal line 101 on an upper portion thereof, the metal line 101 extending from the unit pixel area 100 into the pad area 150. After forming an anti-reflection layer 102 of about 300 Å on the metal line 101, an oxide layer 103 and a nitride layer 104, together forming a passivation layer, are stacked on the entire structure extending from the unit pixel area 100 into the pad area 150.

Referring to FIG. 1B, the nitride layer 104, the oxide layer 103 and the anti-reflection layer 102 are selectively etched to expose a portion of the metal line 101 and create a pad open area 105.

Referring to FIG. 1C, a dyed photoresist 106 is coated on the entire structure. Then, an exposure and development operation is carried out to form a color filter 106 over a light sensing region of the CMOS image sensor. At this time, a portion of the dyed photoresist 106, i.e., the photoresist pattern 106b, covering the pad open portion 105, is removed during the develop operation. Then, a thermal treatment is performed at a temperature of 145° C. to 150° C.

Referring to FIG. 1D, after patterning the color filter 106A, the resulting structure is soaked in a developing solution. This soaking step erodes a portion of the surface of the metal line 107, leaving a high resistance oxide layer 108. This high resistance oxide layer 108 forms a poor contact with any metal ball connected thereto for driving the circuit.

It is, therefore, desirable to have a CMOS image sensor capable of preventing a surface of a metal line from being damaged, oxidized, or otherwise contaminated, thereby improving the performance of the semiconductor memory device.

SUMMARY OF THE INVENTION

In accordance with an aspect of the invention, there is provided a CMOS image sensor comprising: a semiconductor structure, wherein the semiconductor structure includes a unit pixel area and a pad area; a metal line formed on the pad area, wherein a portion of the metal line is exposed; a passivation layer formed on the unit pixel area and on the metal line such that the exposed portion of the metal line is left exposed; a planarized photoresist formed on a portion of the passivation layer; a micro-lens formed on a portion of the planarized photoresist; and an oxide layer formed on the micro-lens, the photoresist, and the passivation layer such that the exposed portion is left exposed.

In accordance with another aspect of the invention, there is provided a method for fabricating a CMOS image sensor, comprising the steps of: a) providing a semiconductor structure, wherein the semiconductor structure includes a metal line formed on an upper portion of the semiconductor structure; b) forming a passivation layer on the metal line; c) forming a planarized photoresist on a portion of the passivation layer; d) forming a micro-lens on a portion of the planarized photoresist; e) forming an oxide layer on the micro-lens, the photoresist, and the passivation layer; and f) forming a pad open mask and etching the oxide layer and the passivation layer to expose a portion of the metal line.

BRIEF DESCRIPTION OF THE DRAWINGS

An exemplary apparatus and method will now be described with reference to the accompanying drawings, in which:

FIGS. 1A to 1D are cross-sectional views showing sequential steps of fabricating a conventional CMOS image sensor;

DETAILED DESCRIPTION OF THE PREFERRED EMBODIMENTS

Figure 1A:
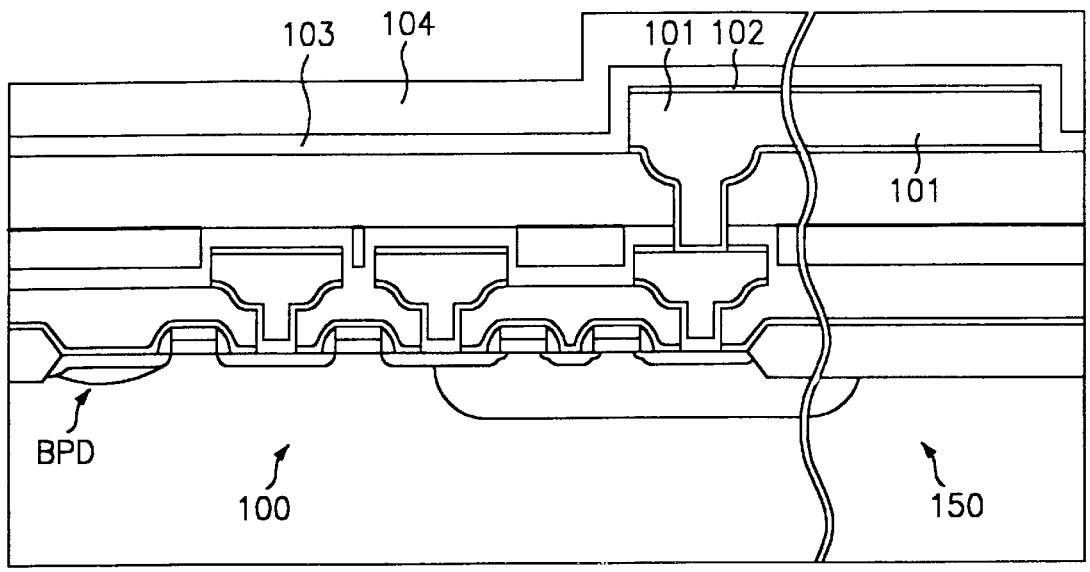
Figure 1B:
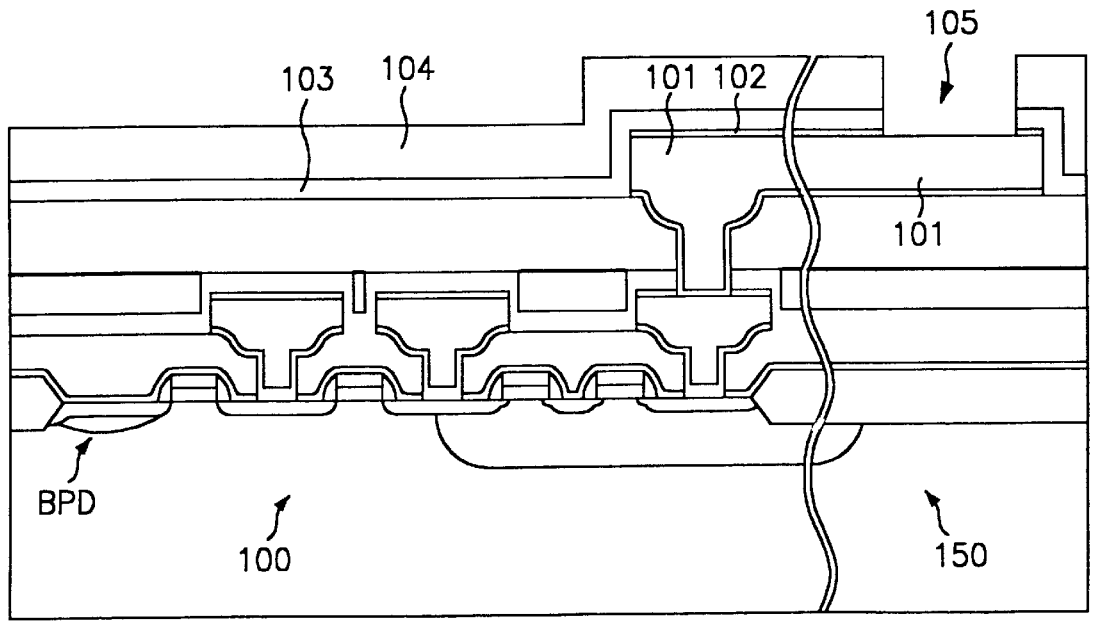
Figure 2:
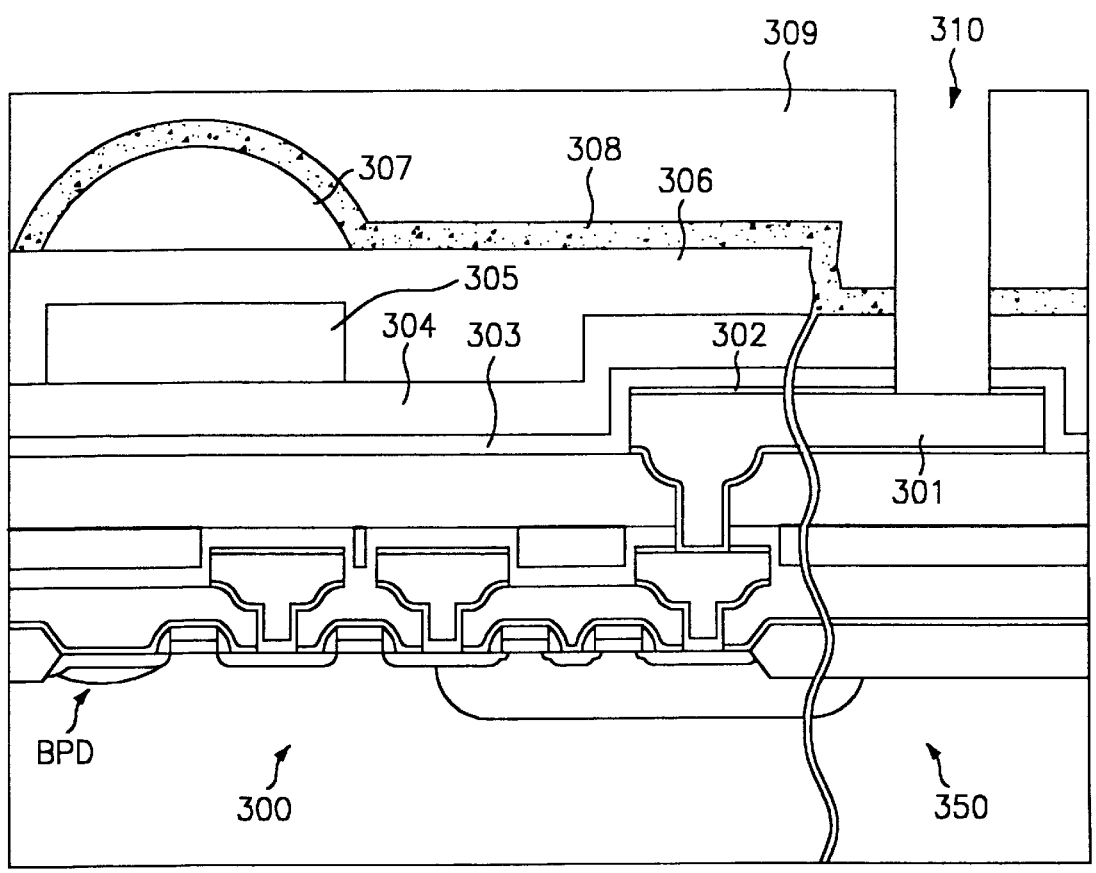
FIG. 2 is a cross-sectional view illustrating an exemplary CMOS image sensor constructed in accordance with the teachings of the present invention.

FIG. 2 is a cross-sectional view illustrating an exemplary CMOS image sensor constructed in accordance with the teachings of the invention. The illustrated CMOS image sensor includes a semiconductor structure having a unit pixel area 300 and a pad area 350. The semiconductor structure also has a pad open area 310; a metal line 301 of which a portion is exposed; an oxide layer 303 and a nitride layer 304, which together serve as a passivation layer; a color filter 305; a planarized photoresist 306 formed on the color filter 305 and the passivation layer; a micro-lens 307 formed on the planarized photoresist 306; and a low-temperature oxide layer 308 formed on the entire structure (e.g., the micro-lens 307, the photoresist 306, and the nitride layer 304 of the passivation laser). The low-temperature oxide layer 308 is formed at a temperature of 150° C. to 200° C. and to a thickness of 3000 Å to 10000 Å. A photoresist layer 309 is also shown and described below. Preferably, the CMOS image sensor further includes an anti-reflection layer 302 formed on the metal line 301.

Figure 3A:
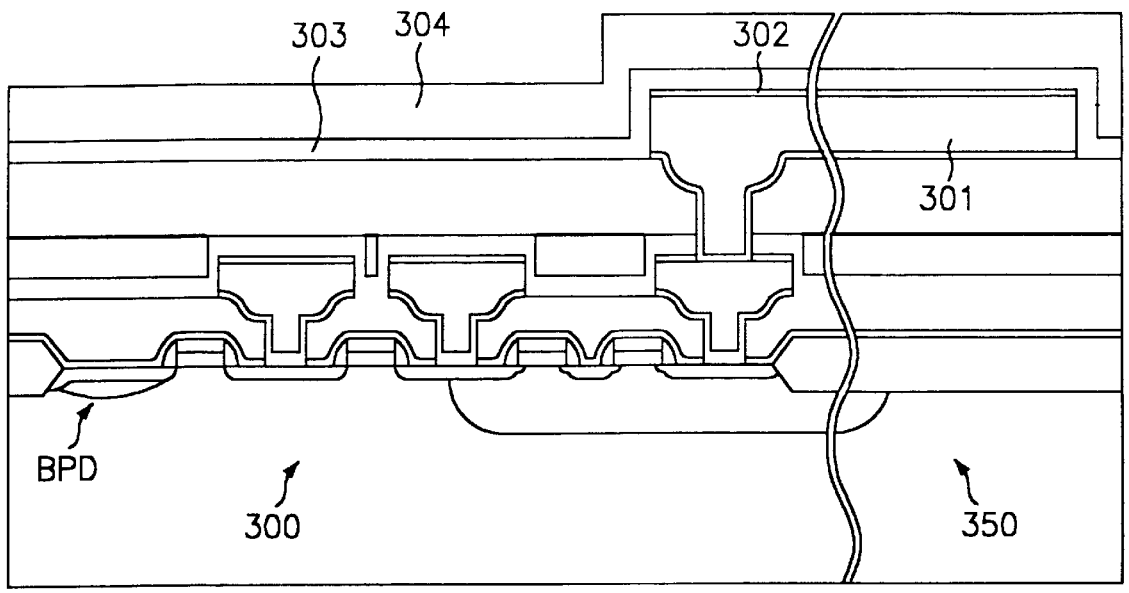
FIGS. 3A to 3E are cross-sectional views illustrating sequential steps in fabricating the CMOS image sensor shown in FIG. 2.

FIGS. 3A through 3E show a method for fabricating the CMOS image sensor of FIG. 2. Referring to FIG. 3A, a series of fabricating operations are carried out to provide a semiconductor structure that has the metal line 301. Then, to protect the semiconductor structure from moisture and scratching, the passivation layer (i.e., the oxide layer 303 and the nitride layer 304) is formed on the entire structure.

Preferably, an anti-reflection layer 302, such as a titanium nitride layer, is formed on the metal line 301 before the two layers of the passivation layer.

Figure 3B:
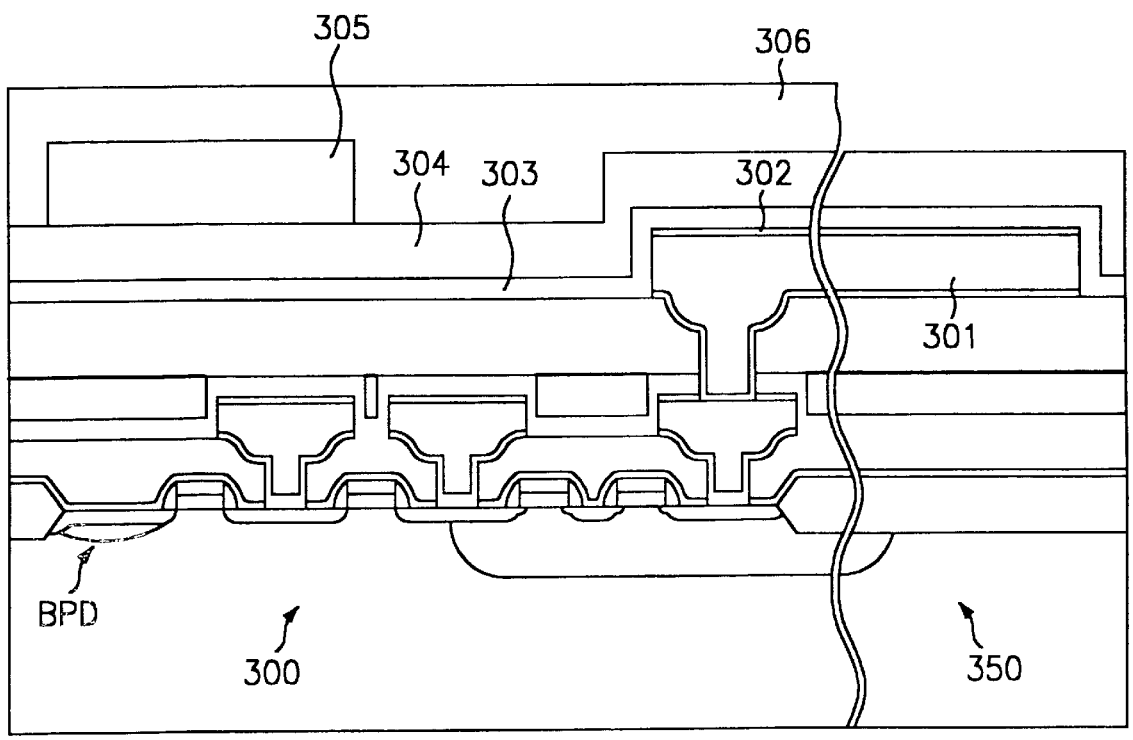

Referring to FIG. 3B, an operation of forming a color filter array is carried out to form the color filter 305. Such operations are known to those of ordinary skill in the art. The color filter 305 may include a red color filter, a green color filter or a blue color filter. The formation of the color filter 305 includes the steps of: a) coating the dyed photoresist 306; b) performing an exposure and development operation to form the color filter 305 on a light sensing region of the CMOS image sensor; and c) performing a thermal treatment thereafter. As shown in FIG. 3B, the planarized photoresist 306 is formed on an upper portion of the unit pixel area 300.

Figure 3C:
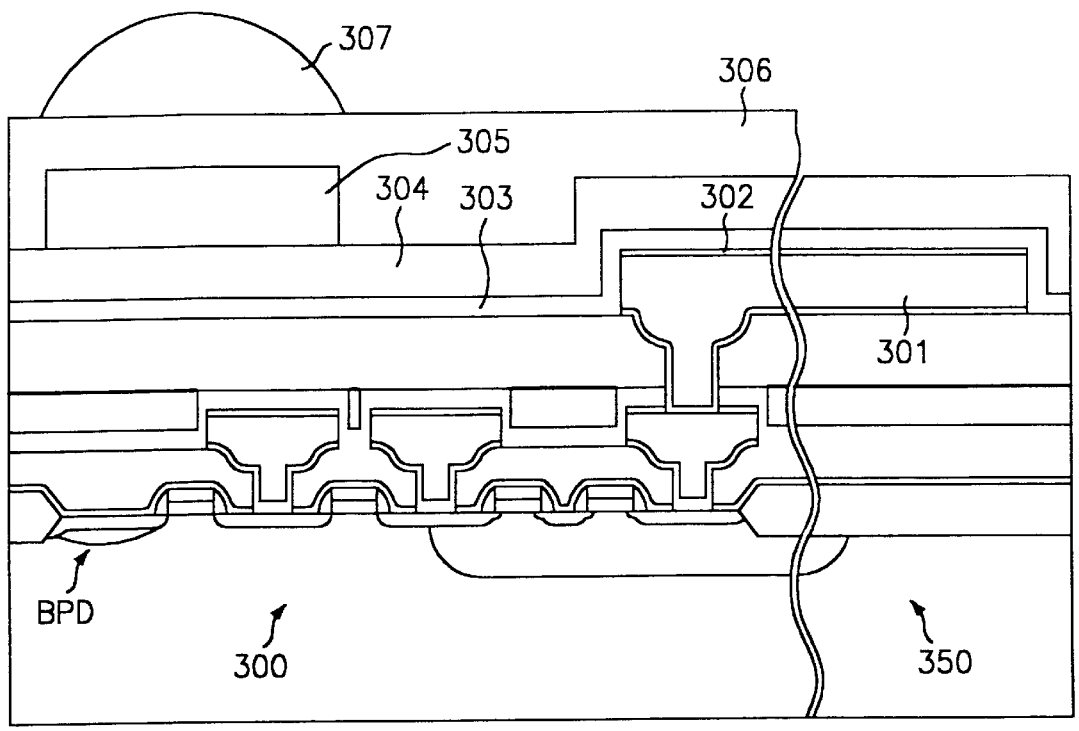
Figure 3D:
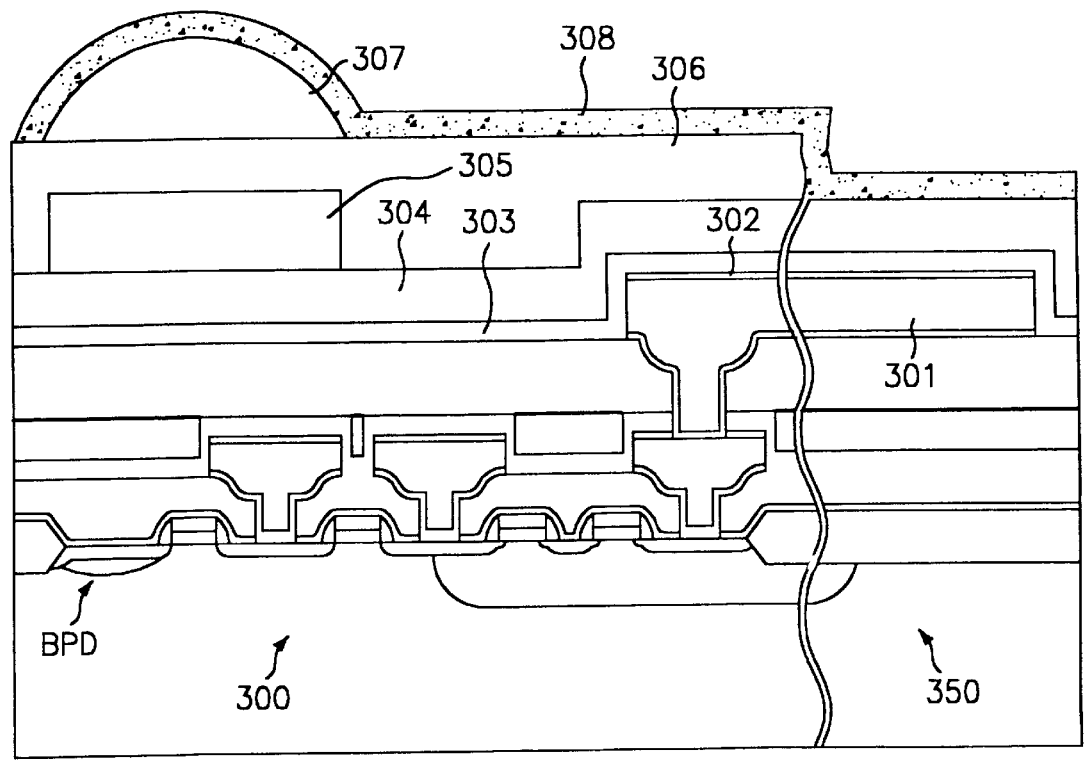

Referring to FIG. 3C, the micro-lens 307 is formed on the planarized photoresist 306, and then, a cleaning operation is performed. Referring to FIG. 3D, the low-temperature oxide layer 308 is coated on the entire structure at a temperature of 150° C. to 200° C. and to a thickness of 3000 Å to 10000 Å.

Figure 3E:
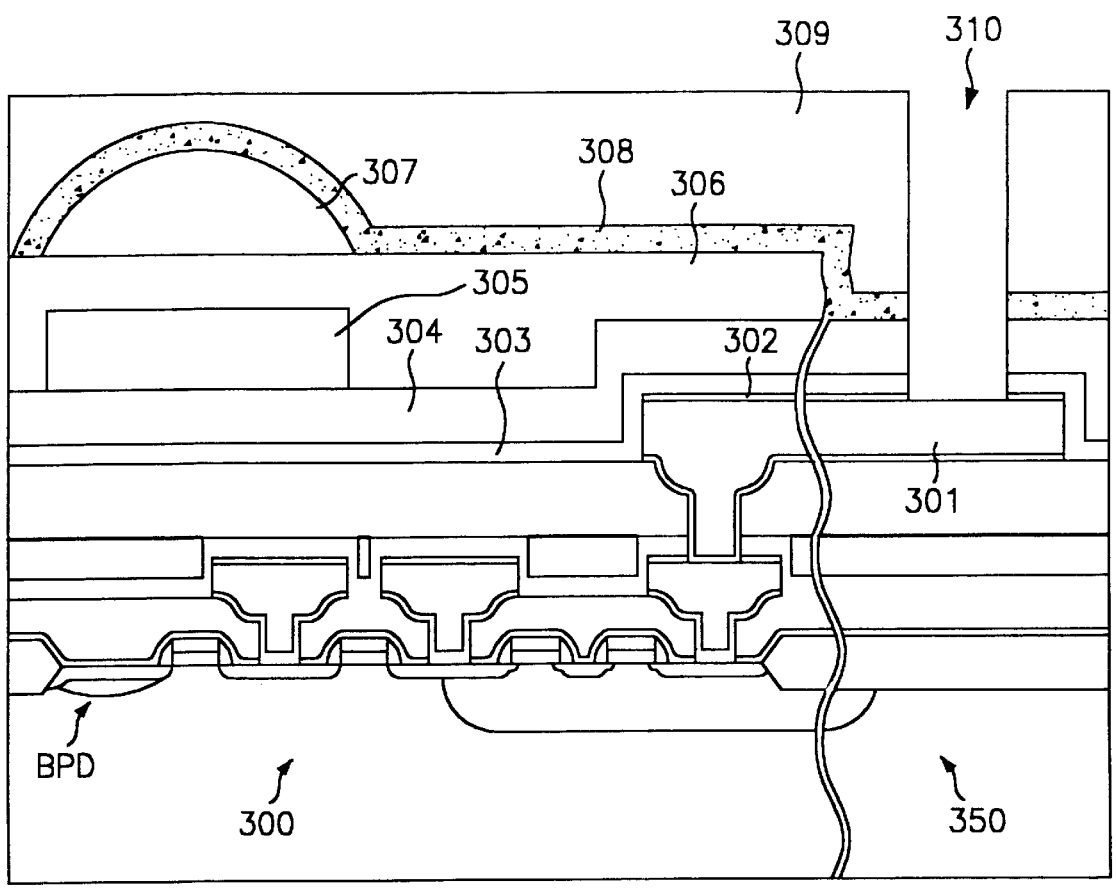

Referring to FIG. 3E, after forming the photoresist pattern 309, the low-temperature oxide layer 308, the nitride layer 304 and the oxide layer 303 are selectively etched to form the pad open portion 310. Then, after removing the photoresist pattern 309 and performing a cleaning operation, a package operation is carried out to thereby obtain a CMOS image sensor chip.

Compared with the prior art, since the pad open area formation is carried out after forming the color filter, the planarized photoresist and the micro-lens, it is possible to prevent the surface of the metal line from being damaged or contaminated, thereby improving yield of the CMOS image sensor chip.

Although preferred examples of an apparatus and a method have been disclosed for illustrative purposes, those skilled in the art will appreciate that the scope of this patent is not limited to those examples. On the contrary, the scope of this patent extends to all apparatuses and methods falling within the scope and spirit of the accompanying claims.

What is claimed is:

1. A CMOS image sensor comprising:
   a semiconductor structure, wherein the semiconductor structure includes a unit pixel area and a pad area;
   a metal line formed on the pad area, wherein a portion of the metal line is exposed;
   a passivation layer formed on the unit pixel area and on the metal line such that the exposed portion of the metal line is left exposed;
   a planarized photoresist formed on a portion of the passivation layer;
   a micro-lens formed on a portion of the planarized photoresist; and
   an oxide layer formed on the micro-lens, the photoresist and the passivation layer such that the exposed portion is left exposed.

2. The CMOS image sensor as recited in claim 1, wherein the oxide layer is formed at a temperature of 150° C. to 200° C.

3. The CMOS image sensor as recited in claim 2, wherein the oxide layer is formed to a thickness of 3000 Å to 10000 Å.

4. The CMOS image sensor as recited in claim 1, wherein the oxide layer is formed to a thickness of 3000 Å to 10000 Å.

5. The CMOS image sensor as recited in claim 1, wherein the passivation layer includes a nitride layer and a second oxide layer.

6. The CMOS image sensor as recited in claim 4, further comprising an anti-reflection layer formed on the metal line such that the exposed portion is left exposed.

7. The CMOS image sensor as recited in claim 1, further comprising an anti-reflection layer formed on the metal line such that the exposed portion is left exposed.

8. A method for fabricating a CMOS image sensor, comprising the steps of:
   a) providing a semiconductor structure, wherein the semiconductor structure includes a metal line formed on an upper portion of the semiconductor structure;
   b) forming a passivation layer on the metal line;
   c) forming a planarized photoresist on a portion of the passivation layer;
   d) forming a micro-lens on a portion of the planarized photoresist;
   e) forming an oxide layer on the micro-lens, the photoresist and the passivation layer; and
   f) forming a pad open mask and etching the oxide layer and the passivation layer to expose a portion of the metal line.

9. The method as recited in claim 8, wherein the oxide layer is formed at a temperature of 150° C. to 200° C.

10. The method as recited in claim 9, wherein the oxide layer is formed to a thickness of 3000 Å to 10000 Å.

11. The method as recited in claim 8, wherein the oxide layer is formed to a thickness of 3000 Å to 10000 Å.

12. The method as recited in claim 8, wherein the passivation layer includes a nitride layer and a second oxide layer.

13. The method as recited in claim 12, further comprising the step of forming an anti-reflection layer on the metal line.

14. The method as recited in claim 13, wherein the exposed portion of the metal line is not covered by the anti-reflection layer.

15. The method as recited in claim 8, further comprising the step of forming an anti-reflection layer on the metal line.

* * * * *